United States Patent [19]

Bogdan et al.

[11] Patent Number: 5,684,366

[45] Date of Patent: Nov. 4, 1997

[54] LAMP PROTECTION DEVICE

[75] Inventors: Alexei Bogdan, Bolton; Emil Sagal, Thornhill, both of Canada

[73] Assignee: W.W. Magee, Ltd., Toronto, Canada

[21] Appl. No.: 510,912

[22] Filed: Aug. 3, 1995

[51] Int. Cl.⁶ .................................. H02H 9/02; G05F 5/02
[52] U.S. Cl. ........................ 315/205; 315/225; 315/74; 315/360; 323/908; 323/326; 363/53
[58] Field of Search .............................. 315/194, 74, 360, 315/71, 225, 205; 323/908, 326, 242; 363/53; 361/58, 111

[56] References Cited

U.S. PATENT DOCUMENTS 3,430,101  2/1969  Biltz ......................................... 315/194

Primary Examiner—Robert Pascal
Assistant Examiner—Arnold Kinkead
Attorney, Agent, or Firm—Benman Collins & Sawyer

[57] ABSTRACT

A lamp protection device includes a circuit to prevent a lamp from being switched on at full line voltage and which provides for the gradual heating of the filament to reduce the expansion rate of the filament. The circuit is connected to a switched alternating current power source and to an incandescent bulb. The circuit includes two silicon controlled rectifiers which are connected in reverse parallel configuration. One of the silicon controlled rectifiers being connected to a capacitor to prevent the full sinusoidal AC current from reaching the lamp until a time delay has expired after the lamp is turned on. A reference switch is connected to the other silicon controlled rectifier to permit the bulb to be turned on only when the AC voltage crosses zero.

9 Claims, 1 Drawing Sheet

LAMP PROTECTION DEVICE

FIELD OF THE INVENTION

This invention relates in general to a lamp protection device and more particularly to a lamp protection device which includes a circuit to permit an incandescent lamp to be switched on without exposing the lamp to potentially harmful current conditions.

BACKGROUND OF THE INVENTION

The life of an incandescent bulb is related to the number of times that the bulb is switched on. Much of the wear on the incandescent bulb is caused by the expansion of the bulb's filament, which occurs when a cold bulb is switched on and the current passing through the filament of the bulb creates a temperature increase in, and a consequent expansion of, the filament. Other effects related to the switching on of a bulb include the exposure of the bulb to spikes in current, or an over-voltage present in the alternating current source voltage.

Therefore, if the expansion rate can be reduced, or the exposure to current spikes or over-voltages eliminated, the life of the filament can be extended, thereby extending the life of the bulb.

The resistance of a bulb's filament when there is no current supplied to the bulb and it is at at room temperature is many times less than is the resistance for the same bulb when the bulb is on and has reached its normal operating temperature. For a typical bulb, the resistance in the on (hot) state may be in the range of 5 times greater than the resistance in the off (cold) state.

The expansion rate of the filament in an incandescent lamp is related to the square of the rate of temperature increase. It is therefore desirable to limit the initial current which passes through the filament of an incandescent bulb following switching on the bulb.

Prior art devices have been devised to address the aforenoted problems.

However, the prior art devices do not disclose a simple circuit that will prevent an incandescent bulb from being switched on when full line voltage is present, which provide for the gradual heating of the filament to reduce the expansion rate of filament, and which prevent the bulb from being exposed to current spikes and over-voltages.

Thus a type of lamp protection device which prevents an incandescent bulb from being switched on when full line voltage is present and which provides for the gradual heating of the filament to reduce the expansion rate of filament is desirable.

SUMMARY OF THE INVENTION

An object of one aspect of the present invention is to provide an improved lamp protection device.

In accordance with one aspect of the present invention there is provided a lamp protection device having a circuit for connection to a switched alternating current power source and to an incandescent lamp, the circuit comprising a first silicon controlled rectifier and a second silicon controlled rectifier, the first silicon controlled rectifier being connected in reverse-parallel configuration with the second silicon controlled rectifier, and a capacitor, the capacitor being connected to gate of the second silicon controlled rectifier and to the alternating current power source for preventing the second silicon controlled rectifier from conducting while the voltage across the capacitor is below a predetermined threshold, the predetermined threshold being selected to provide a time delay following the switched alternating current power source being switched on, the time delay being sufficient to permit the filament of a selected incandescent lamp to reach a temperature within the range of the filament's typical operating temperature.

Preferably, there is a reference switch, the reference switch being connected to the gate of the first silicon controlled rectifier to initially permit the first silicon controlled rectifier to conduct current only when the voltage of the alternating current from the alternating current power source crosses zero.

In one embodiment, there is provided a resistor having high ohmic resistance connected across the capacitor.

In another embodiment, there is provided a bi-directional switch connected to the capacitor and the gate of the second silicon controlled rectifier, the reference point of the bi-directional switch being connected to a switch divider, the switch divider being connected to the alternating current power source such that the bi-directional switch is prevented from being turned on when the alternating current exceeds a predetermined line voltage.

In another embodiment there is provided a capacitor divider connected to the capacitor such that the capacitor is charged through the capacitor divider.

In another embodiment there is provided a silicon controlled rectifier divider connected to the gate of the first silicon controlled rectifier.

Advantages of the present invention include the extension of the lives of incandescent lamps used in conjunction with the circuit of the invention. An advantage of an embodiment of the present invention is that an incandescent bulb used in conjunction with the device of the invention is prevented from being switched on when full line voltage is present and the gradual heating of the filament to reduce the expansion rate of filament is achieved.

BRIEF DESCRIPTION OF THE DRAWINGS

A detailed description of the preferred embodiment is provided herein below with reference to the following drawing, in which.

Figure 1:
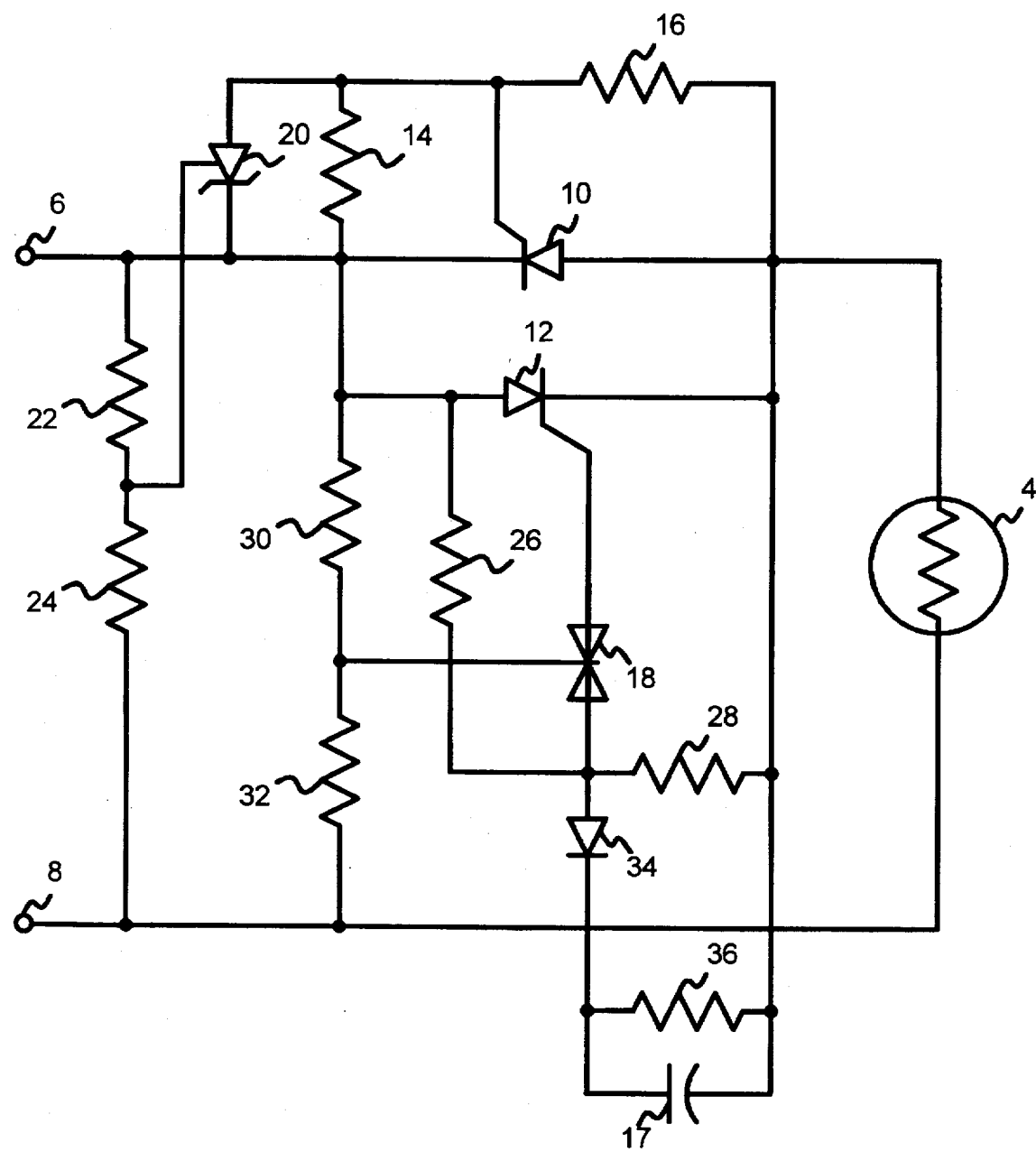
FIG. 1, in a schematic view, illustrates an electrical circuit of a device in accordance with the preferred embodiment of the present invention.

In the drawing, the preferred embodiment of the invention is illustrated by way of example. It is to be expressly understood that the description and drawing are only for the purpose of illustration and as an aid to understanding, and are not intended as a definition of the limits of the invention.

DETAILED DESCRIPTION OF THE PREFERRED EMBODIMENT

Referring to FIG. 1, there is illustrated in a schematic view, a circuit of the lamp protection device in accordance with the preferred embodiment of the present invention. The circuit of the preferred embodiment shown in FIG. 1 is shown connected to an incandescent bulb 4. The circuit has contacts 6, 8 for connection to an AC source.

The circuit of FIG. 1 has silicon controlled rectifiers 10, 12, connected in reverse-parallel configuration. The gate of silicon controlled rectifier 10 is connected to a divider made up of resistors 14, 16. The gate of silicon controlled rectifier 12 is connected to a capacitor 17 by way of a bi-directional switch 18.

The circuit of FIG. 1 also includes a reference switch 20 which is connected to the divider of resistors 14, 16. Reference switch 20 is, in turn, connected to the divider made up of resistors 22, 24.

The bi-directional switch 18 is connected to a divider made up of resistors 26, 28 and a divider made up of resistors 30, 32. It swiches the capacitor 17. Capacitor 17 is connected to diode 34 which maintains the charge on the capacitor and to resistor 36, having a high ohmic resistance.

In operation, the circuit of FIG. 1 can prolong the life of the incandescent bulb 4. How this is achieved is explained herebelow with reference to FIG. 1.

When an alternating current source is applied to terminals 6, 8, silicon controlled rectifier 10 will commence conducting. However, silicon controlled rectifier 10 is driven by a signal from the divider made up of resistors 14, 16, only when the reference switch 20 is off. This occurs only when the supply voltage sine wave crosses zero. This prevents the lamp filament from being under full or partial voltage at the moment when power is first applied to the lamp 4. The divider of resistors 22, 24 is set to have a switching time as close to zero volts as possible, making the switching of silicon controlled rectifier 10 more stable.

After the silicon controlled rectifier 10 becomes conductive, the lamp filament begins to conduct a current and becomes gradually hot. During this initial period, silicon controlled rectifier 12 remains off so that the current supplied to lamp 4 is one half the sinusoidal current of the alternating current source. This ensures that the heating of the filament of lamp 4 occurs more slowly than would be the case if the full AC current was supplied to lamp 4.

The length of time that silicon controlled rectifier 12 prevents the full AC current from being applied to lamp 4 is controlled by the charging of capacitor 17 through divider resistors 26, 28. At the moment that the voltage of capacitor 17 reaches sufficient level for bi-directional switch 18 to be conductive, the switch 18 turns on and provides a signal to the gate of silicon controlled rectifier 12. This in turn permits the full sinusoidal wave form of the AC current source to pass through to lamp 4. The time delay is selected to permit the full AC current source to be provided to the lamp as soon as possible, while allowing the lamp sufficient heating time to prolong the life of the lamp. The temperature at which the filament is sufficiently heated will be considered to be within the range of operating temperatures of the lamp. Certainly, if the lamp is able to reach a steady-state temperature before the full AC current is supplied, the advantage of this aspect of the invention is more fully realized.

Diode 34 maintains the charge on capacitor 17 and provides a control signal for silicon controlled rectifier 12 at the zero volts point.

The circuit of FIG. 1 also has divider resistors 30, 32 which divider is connected to the reference point of the bi-directional switch 18 and prevents it from turning on in cases when the supply voltage, for any reason, becomes greater than a predefined acceptable line voltage.

As is apparent, a lamp may be in the on state and then be switched off and on again in rapid succession. If the lamp is already at a state where the filament is at the operating temperature, there is no need to reduce the current to one half the AC waveform. For this reason, resistor 36 is provided. Resistor 36 has high ohmic resistance and serves as an automatic time delay for capacitor 17 in respect of the time between any successive rapid switching of lamp 4.

In summary, a lamp protection device is provided with a circuit for preventing the lamp from being turned on at either full voltage or with spikes and provides a period of reduced current during which the filament of the incandescent lamp may become heated.

Other variations and modifications of the invention are possible. All such modifications or variations are believed to be within the sphere and scope of the invention as defined by the claims appended hereto.

We claim:

1. A lamp protection device having a circuit for connection to a switched alternating current power source and to an incandescent lamp having a filament, the circuit comprising
   a first silicon controlled rectifier and a second silicon controlled rectifier, each of the first and second silicon controlled rectifiers having gates,
   the first silicon controlled rectifier being connected in reverse-parallel configuration with the second silicon controlled rectifier, the second silicon controlled rectifier being capable of allowing increased current flow to an output when the second silicon controlled rectifier is conducting;
   a capacitor,
   the capacitor being connected to the gate of the second silicon controlled rectifier and to the switched alternating current power source for preventing the second silicon controlled rectifier from conducting while the voltage across the capacitor is below a predetermined threshold,
   the predetermined threshold being selected to provide a time delay following the switched alternating current power source being switched on, the time delay being sufficient to permit the filament of a selected incandescent lamp to reach a temperature within the range of the filament's typical operating temperature; and
   a resistor having high ohmic resistance connected across the capacitor.

2. The lamp protection device of claim 1, further comprising a reference switch,
   the reference switch being connected to the gate of the first silicon controlled rectifier to initially permit the first silicon controlled rectifier to conduct current only when the voltage of the alternating current from the switched alternating current power source crosses zero.

3. The lamp protection device of claim 1, further comprising a bi-directional switch connected to the capacitor and the gate of the second silicon controlled rectifier, the reference point of the bi-directional switch being connected to a switch divider, the switch divider being connected to the switched alternating current power source such that the bi-directional switch is prevented from being turned on when the alternating current exceeds a predetermined line voltage.

4. The lamp protection device of claim 1, further comprising a capacitor divider connected to the capacitor such that the capacitor is charged through the capacitor divider.

5. The lamp protection device of claim 1, further comprising a silicon controlled rectifier divider connected to the gate of the first silicon controlled rectifier.

6. The lamp protection device of claim 2, further comprising a bi-directional switch connected to the capacitor and the gate of the second silicon controlled rectifier, the reference point of the bi-directional switch being connected to a switch divider, the switch divider being connected to the switched alternating current power source such that the bi-directional switch is prevented from being turned on when the alternating current exceeds a predetermined line voltage.

7. The lamp protection device of claim 2, further comprising a capacitor divider connected to the capacitor such that the capacitor is charged through the capacitor divider.

8. The lamp protection device of claim 2, further comprising a silicon controlled rectifier divider connected to the gate of the first silicon controlled rectifier.

9. A lamp protection device having a circuit for connection to a switched alternating current power source and to an incandescent lamp having a filament, the circuit comprising a first silicon controlled rectifier and a second silicon controlled rectifier, each of the first and second silicon controlled rectifiers having gates, the first silicon controlled rectifier being connected in reverse-parallel configuration with the second silicon controlled rectifier;

a capacitor, the capacitor being connected to the gate of the second silicon controlled rectifier and to the switched alternating current power source for preventing the second silicon controlled rectifier from conducting while the voltage across the capacitor is below a predetermined threshold, the predetermined threshold being selected to provide a time delay following the switched alternating current power source being switched on, the time delay being sufficient to permit the filament of a selected incandescent lamp to reach a temperature within the range of the filament's typical operating temperature; and a reference switch, the reference switch being connected to the gate of the first silicon controlled rectifier to initially permit the first silicon controlled rectifier to conduct current only when the voltage of the alternating current from the switched alternating current power source crosses zero.

* * * * *